US006307600B1

(12) United States Patent
Wink

(10) Patent No.: US 6,307,600 B1
(45) Date of Patent: Oct. 23, 2001

(54) TUNING WITH DIODE DETECTOR

(75) Inventor: Meye Wink, Eindhoven (NL)

(73) Assignee: U.S. Philips Corporation, New York, NY (US)

(*) Notice: Subject to any disclaimer, the term of this patent is extended or adjusted under 35 U.S.C. 154(b) by 0 days.

(21) Appl. No.: 09/265,215

(22) Filed: Mar. 10, 1999

(30) Foreign Application Priority Data

Mar. 13, 1998 (EP) .................................................. 98200802

(51) Int. Cl.[7] .............................. H04N 7/00; H04N 5/50; H04N 5/44; H04N 5/455; H04B 1/18
(52) U.S. Cl. ........................ 348/731; 348/731; 348/732; 348/733; 348/554; 348/558; 348/725; 455/150.1; 455/188.2; 455/189.1; 455/190.1; 455/180.1; 455/180.2
(58) Field of Search ........................... 348/554, 558, 348/725–733; 455/150.1, 180.1, 180.2, 188.2, 189.1, 190.1; H04N 5/50

(56) References Cited

U.S. PATENT DOCUMENTS

| | | | |
|---|---|---|---|
| 4,198,604 | * | 4/1980 | Holdaway ............................ 455/260 |
| 4,322,856 | * | 3/1982 | Ohta et al. ............................ 455/189 |
| 4,352,098 | * | 9/1982 | Stephen et al. ....................... 340/572 |
| 4,385,315 | * | 5/1983 | George et al. ..................... 358/191.1 |
| 4,403,346 | * | 9/1983 | Ogawa ................................. 455/189 |
| 4,982,444 | * | 1/1991 | Matsuura ............................. 455/188 |
| 5,204,645 | * | 4/1993 | Hohmann ................................ 334/1 |
| 5,731,841 | * | 3/1998 | Rosenbaum et al. ................ 348/463 |
| 5,859,674 | * | 1/1999 | Chevallier ........................... 348/731 |
| 6,091,943 | * | 7/2000 | Nyenhuis ............................. 455/260 |
| 6,151,488 | * | 11/2000 | Brekelmans ...................... 455/150.1 |

OTHER PUBLICATIONS

"Television and Audio Handbook for Technicialns and Engineers" by K. Blair Benson et al., in Television Reception, Chapter Nine, pp. 9.20–9.23.

* cited by examiner

Primary Examiner—Reinhard J. Eisenzopf
Assistant Examiner—Paulos M. Natnael
(74) Attorney, Agent, or Firm—Steven R. Biren

(57) ABSTRACT

A tuner, for example, for a television receiver, includes a UHF and a VHF section and a mixer oscillator stage. It is known that the VHF frequency band has to be split in at least two parts to handle the VHF signals. To that end, the mixer oscillator stage uses two separate VHF oscillators and a detector to switch tuned parts of the VHF section. In this way, the performance of the tuner is improved.

5 Claims, 3 Drawing Sheets

TUNING WITH DIODE DETECTOR

BACKGROUND OF THE INVENTION

1. Field of the Invention

The invention relates to a tuner for tuning an input signal, having an input for receiving the input signal, a UHF section coupled to the input for handling UHF signals, a VHF section coupled to the input for handling VHF signals, the UHF section and the VHF section being coupled, with outputs, to a mixer oscillator stage which comprises UHF oscillation means with a UHF tuning circuit, and VHF oscillation means with a VHF tuning circuit, said mixer oscillator stage being coupled to an output of the tuner. The invention further relates to a mixer oscillator stage.

The invention further relates to a receiver, more particularly, but not exclusively to a television receiver.

2. Description of the Related Art

Such a tuner is used in, for example television receivers. For such a tuner, different solutions are known. As is known, television signals comprise signals in the so-called UHF and VHF band, which are tuned with a UHF section and a VHF section. Tuning can, for example be accomplished by the change in capacitance with an applied dc voltage to varicap diodes. One diode is used in each tuned circuit. Tuning the signals of the UHF band can be covered by a single varicap diode, whereas the tuning of the signals of the VHF band has to be split into at least two ranges and at least two varicap diodes are necessary. The most straight forward solution is to use a so-called 3-band concept (UHF, VHFL and VHFH) having, for each band, its own path: a tuned input circuit, a so-called RF amplifier and a bandpass filter. The UHF, VHFL and VHFH sections are then followed by a mixer oscillator (and PLL) stage.

As the above solution is quite complex, nowadays, to reduce the costs of three separate bands, a switching between the low and high VHF signals (channels) is used. A solution to perform this is to simply short-circuit, with a switching diode, a part of the tuning coil in the relevant resonant circuit to change the tuning frequency range. To obtain the off state of the switching diode, it is well known in the art to supply a negative voltage to the anode of the switching diode. Further, it is known that when the negative voltage is not connected to the switching diode, the switching diode in the oscillator circuit operates as a detector and provides a negative voltage for the other tuned circuits.

See for example "Television and Audio Handbook, page 9.22, Figure. 9.15".

One of the disadvantages of the use of a diode detector is that a good switching diode is a poor detector. Sometimes the switching diode for the oscillator circuit is selected using a so-called detector test.

SUMMARY OF THE INVENTION

An object of the invention is to provide a tuner, a mixer oscillator stage and a receiver that do not have the disadvantages of the prior art, and, further, to improve the performance and to lower the costs of a tuner. To this end a first aspect of the invention provides a tuner as described in the opening paragraph, characterized in that the VHF oscillation means comprises a first and a second VHF oscillator, with, respectively, a first and a second VHF tuning circuit for, respectively, a first and a second VHF frequency range, and the tuner comprises detecting means for detecting which VHF oscillator is operating, the detecting means being arranged to supply a switching signal to the switchable elements of the VHF section. A second aspect of the invention provides a mixer oscillator stage for use in such a tuner. A third aspect of the invention provides a receiver compromising such as a tuner.

The invention is based on the recognition that by using two separate oscillators for the VHF signals, less parallel capacitance on the lower band VHF oscillator circuit exists than with a biased switching diode in a combined VHF tuning circuit of one VHF oscillator. Further, the tuner is much less complex as the known 3-band concept and as the known switched version. By detecting the VHFL oscillator signal when this oscillator is switched on, the detecting means provides a negative voltage to switch-off the switching diodes of the other tuned circuits.

An embodiment of a tuner according to the invention characterized in that the VHF section comprises a series arrangement of a switchable tuned input circuit, an amplifier stage, a switchable primary high frequency band filter and a switchable secondary high frequency band filter, these switchable circuits being under switching control of the detecting means.

All tuned circuits of the VHF section are supplied with the switching signal of the detecting means.

An embodiment of a tuner according to the invention characterized in that the detecting means comprises a diode detector coupled to the first VHF tuning circuit, the detecting means being part of the mixer oscillator stage.

Normally, capacitance can be added to further improve tracking in the lower VHF band, but by adding a diode detector as detecting means instead, a negative voltage can be generated. This negative voltage can then be used as switching signal for the other switchable tuned circuits of the VHF section.

BRIEF DESCRIPTION OF THE DRAWINGS

The invention and additional features which may optionally be used to implement the invention to advantage will be apparent from and elucidated with reference to the examples described hereinafter and shown in the Figures, in which.

Throughout the description same elements will be indicated with corresponding reference signs.

DESCRIPTION OF THE PREFERRED EMBODIMENTS

Figure 1:
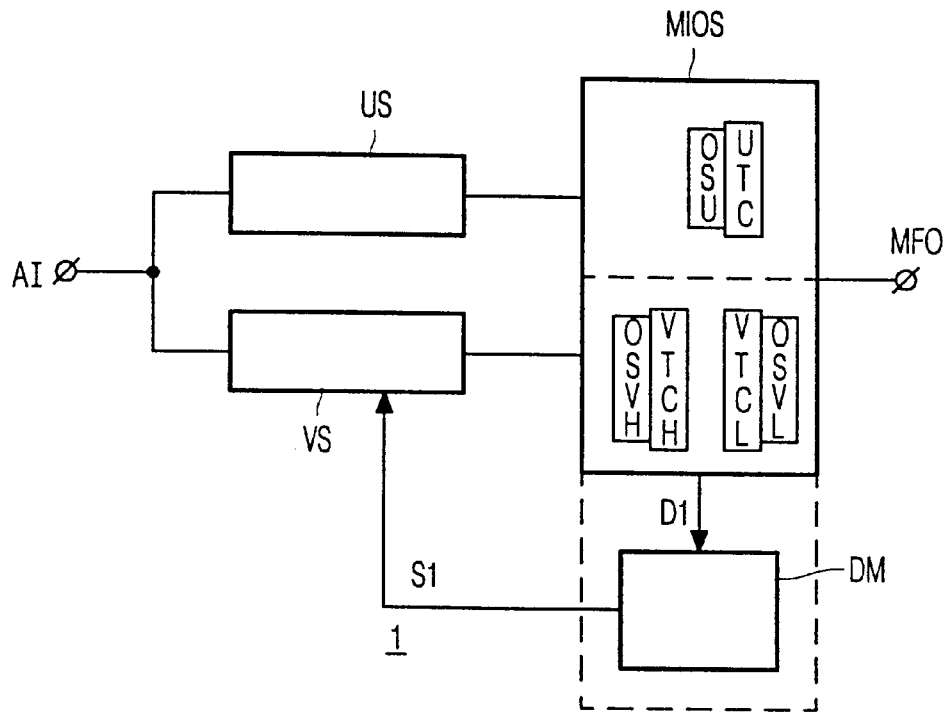
FIG. 1 shows a block schematic diagram of a tuner according to the invention.

FIG. 1 shows a block schematic diagram of a tuner 1 according to the invention. The tuner has an input AI, for an antenna, or a cable input. Further the tuner comprises a UHF section US and a VHF section VS for handling, respectively, the UHF and VHF signals. The outputs of the UHF section and the VHF section are coupled to a mixer oscillator stage MIOS, which comprises a UHF oscillator OSU with a UHF tuned circuit UTC, and a first and a second VHF oscillator OSVL and OSVH with respective VHF tuned circuits VTCL and VTCH, whereby the tuned circuits normally will be located outside an integrated circuit whereas the other parts of the mixer oscillator stage MIOS can be located inside the integrated circuit.

An output of the mixer oscillator stage is coupled to an output MFO of the tuner 1 for supplying the MF signal.

The tuner further comprises detecting means DM which can be part of the mixer oscillator stage (dashed line in FIG. 1) for receiving a detecting signal D1 from the mixer oscillator stage and for supplying a switching signal S1.

At the input AI, the tuner receives signals, for example, television signals being in different frequency bands (VHF and UHF). The VHF section and the UHF section select the relevant frequencies. Further, the mixer oscillator stage MIOS is programmed to receive the relevant frequency band by switching on the relevant oscillator that is, the UHF oscillator (OSU), or the first (OSVL) or second (OSVH) VHF oscillator, and a port to supply a relevant voltage or current as is known in the art. When the first (lower) VHF frequency band has to be received the first VHF oscillator is operating and the detecting means receive a detecting signal D1 from the mixer oscillator stage and supply a switching signal S1 (for example, negative voltage) to the switching diode's of the tuned circuits in the VHF section.

Below the operation of an example of the tuner according to the invention will be further described with reference to FIGS. 2, 3 and 4.

Figure 2:
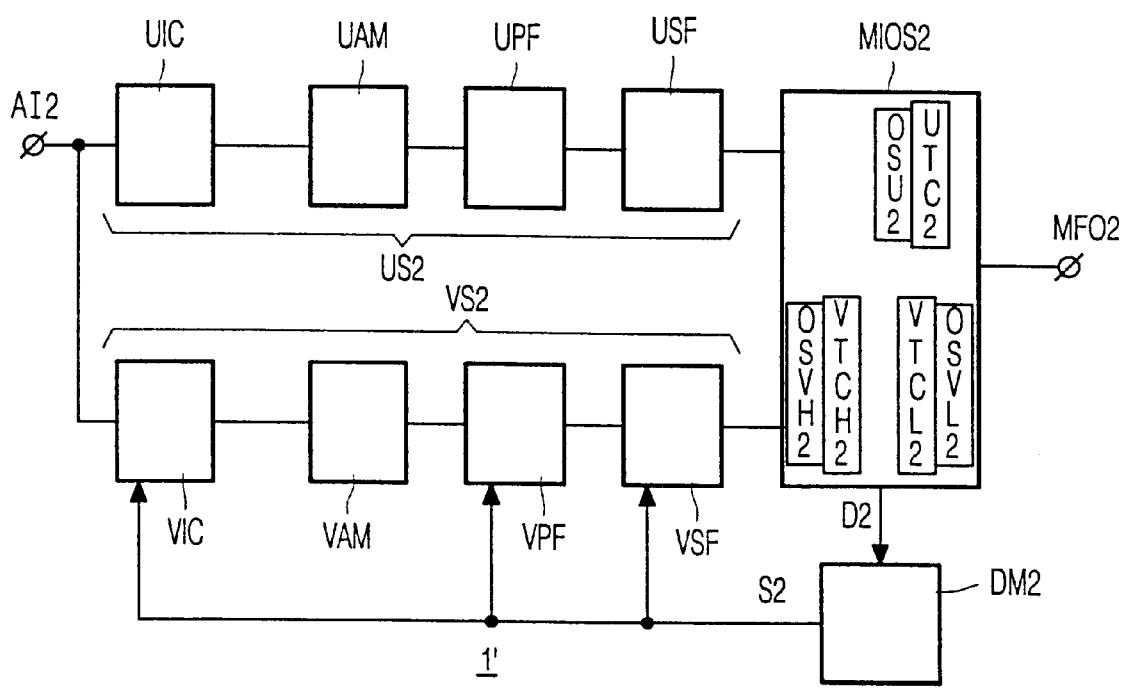
FIG. 2 shows a block schematic diagram of a tuner according to the invention in more detail.

FIG. 2 shows an embodiment of a tuner 1' according to the invention in more detail. Herein, the UHF section and VHF section are shown in more detail. Normally both the UHF and the VHF section comprise a tuned input circuit UIC and VIC, respectively, a (RF) amplifier stage UAM and VAM, respectively a primary high frequency band filter UPF and a secondary high frequency band filter USF and USF, respectively. Except for the amplifier stage, all other parts of the UHF and VHF section contain tuned circuits which normally comprise so called varicaps and inductances, whereby the varicaps receive a tuning voltage (not shown in this figure, see FIG. 3 for more details).

The parts of the VHF section having tuned circuits also have to change over from the first (lower) VHF frequency band to the second (higher) VHF frequency band or vice versa. This changing over is achieved by switching on the relevant oscillator and port (see FIG. 4, Q41).

Also in this example, the mixer oscillator stage MIOS2 comprises a UHF oscillator OSU2 with a UHF tuned circuit UTC2, and a first and second VHF oscillator OSVL2 and OSVH2 with a first and a second VHF tuned circuit VTCL2, and VTCH2, respectively.

When operating in the lower VHF frequency band, the oscillator OSVH2 is switched off and the first VHF oscillator OSVL2 is operating. The detecting signal D2, indicating that the first VHF oscillator is operating, is supplied to the detecting means DM2, the detecting means providing the switching signal S2 as the negative voltage to switch off the switching diodes of the tuned circuits of the VHF section.

Figure 3:
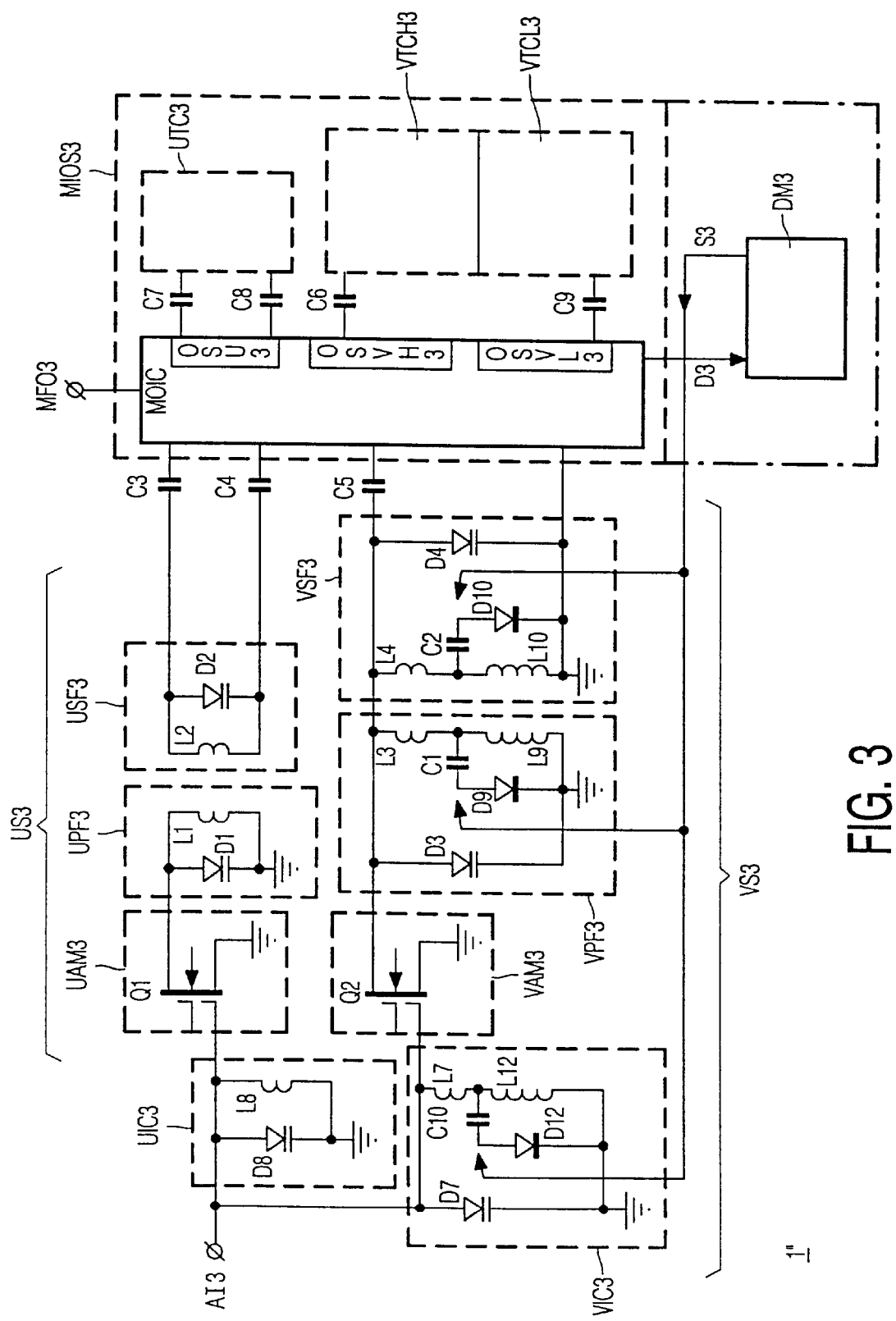
FIG. 3 shows a more detailed block schematic diagrams of a tuner of the invention.

FIG. 3 shows a schematic block diagram of a tuner 1" according to the invention in more detail. Herein the UHF section US3 and the VHF section VS3 are showed in more detail. The input AI3 is coupled to the respective tuned input circuit UIC3 and VIC3. These tuned input circuits comprise a varicap diode D8 and D7, respectively, and an inductance L8 and a series arrangement of a inductance L7 and a parallel arrangement of an inductance L12 and a capacitor C10 in series with a switching diode D12, respectively. The varicap diodes D8 and D7 receive a (not shown) tuning voltage for tuning to the requested frequency.

The switching diode D12 of the tuned input circuit VIC 3 is coupled to the detecting means DM3 for receiving a switching signal S3.

The tuned input circuits UIC3 and VIC3, respectively are coupled to the (RF) amplifier stage UAM3 and VAM3, respectively. Each amplifier stage is coupled to a primary high frequency band filter UPF3 and VPF3, respectively, whereby each filter comprises a varicap diode D1 and D3, respectively, and an inductance L1 and a series of arrangement of an inductance L3 and a parallel arrangement of an inductance L9 and a capacitor C1 in series with a switching diode D9, respectively.

This switching diode D9 of the primary high frequency band VPF3 also receives the switching signal S3 from the detecting means DM3. The varicap diode's D1 and D3, respectively, also receive a (not shown) tuning voltage.

Each primary high frequency band filter is coupled to a secondary high frequency band filter USF3 and VSF3, respectively, whereby each filter comprises a varicap diode D2 and D4, respectively, and an inductance L2 and a series arrangement of an inductance L4 and a parallel arrangement of an inductance L10 and a capacitance C2 in series with a switching diode D10. Also the varicap diodes D4 and D2, respectively, receive a (not shown) tuning voltage.

This switching diode D10 of the secondary high frequency band filter VSF3 also receives the switching signal S3 from the detecting means DM3.

Each secondary high frequency filter USF3, respectively, is coupled to the mixer oscillator stage MIOS3. In the figure, the coupling is simplified with capacitances C3, C4 and C5. As is known to the man skilled in the art, the practical coupling is more complex, but, as being not relevant to the invention concerned, not further explained here.

In this example, the mixer oscillator stage MIOS3 comprises the UHF tuning circuit UTC3, a first VHF tuning circuit VTCL3 and a second VHF tuning circuit VTCH3, coupling capacitances C7, C8, C6, and C9 and a mixer oscillator integrated circuit MOIC comprising a UHF oscillator and a first VHF oscillator OSVL3 and a second VHF oscillator OSVH3. The tuned circuits of the oscillators are normally placed outside the integrated circuit. As the mixer oscillator integrated circuit, for example, a Philips TDA6404 can be used. Further, the mixer oscillator stage MIOS3 can comprise the detecting means DM3 (dash-point line).

The detecting means is coupled to the mixer oscillator stage MIOS for receiving a detecting signal D3 which indicates that the first (lower) VHF oscillator OSVL3 is operating. The detecting means DM3 supplies on the basis of the detecting signal the switching signal S3 to the switching diodes of the relevant parts of the VHF section VS3. The mixer oscillator integrated circuit MOIC is coupled to the output MFO3 of the tuner for supplying the MF signal.

Figure 4:
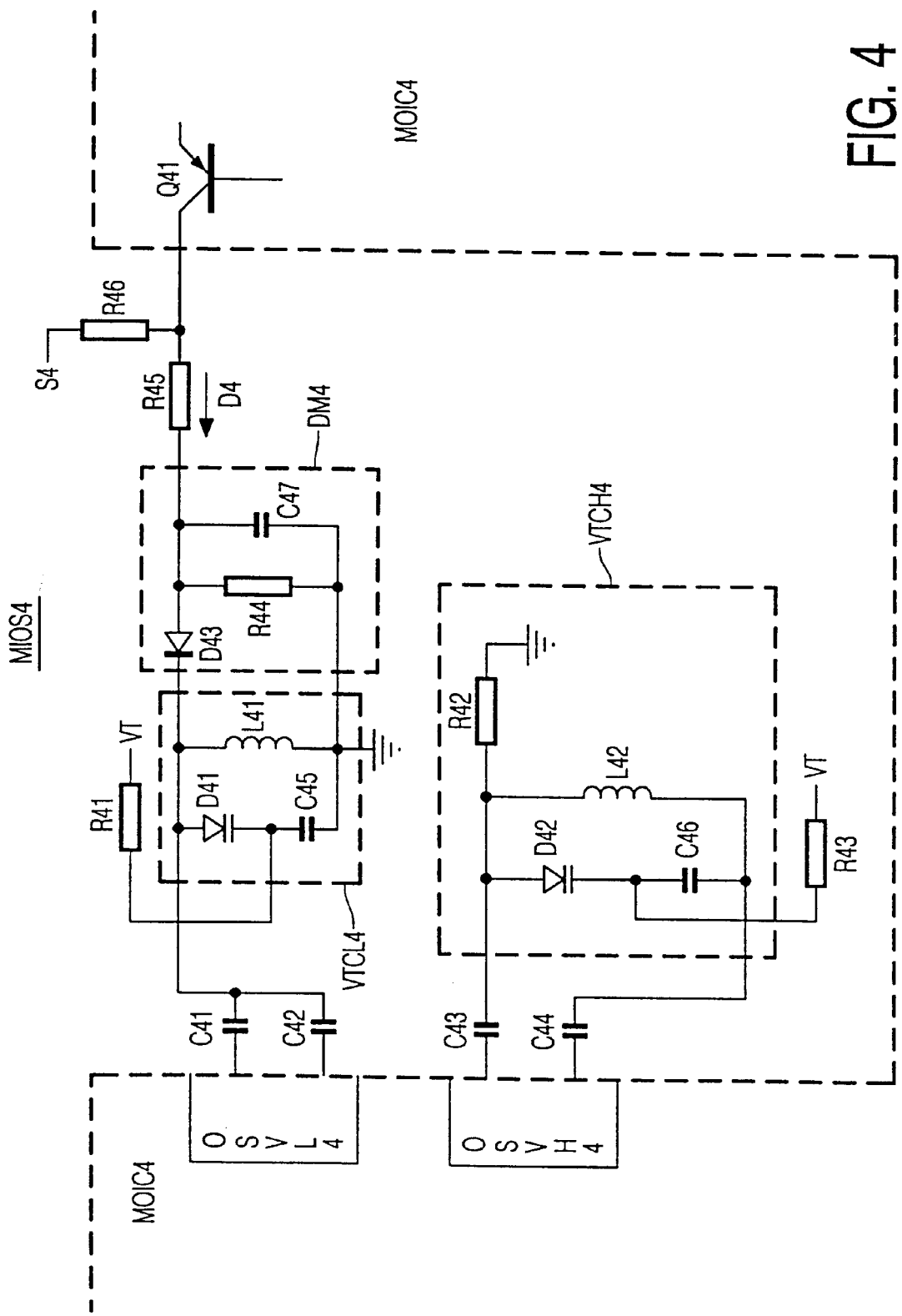
FIG. 4 shows part of a schematic diagram of a mixer oscillator stage according to the invention.

FIG. 4 shows, in more detail, part of a schematic diagram of a mixer oscillator stage. This diagram shows a first tuning circuit VTCL4 for the first VHF frequency band (lower) and a second tuning circuit VTCH4 for the second VHF frequency band (higher). The first tuning circuit VTCL4 comprises an inductance L41 and a series arrangement of a varicap diode D41 and a capacitance C45. Between the varicap diode and the capacitance a tuning voltage VT is supplied via a resistor R41. This tuning circuit is coupled via capacitances C41 and C42 to the mixer oscillator integrated circuit MOIC4 to a first VHF oscillator OSVL4.

A detecting means DM4 is coupled in parallel to the inductance L41 and comprises a diode D43 operating as a detector and a parallel arrangement of a resistor R44 and a capacitance C47. The cathode of the diode D43 is coupled, via a resistor R45, to a transistor Q41 of the mixer oscillator integrated circuit MOIC4. This transistor is the VHFH port that supplies a positive voltage when switched on. When the first VHF oscillator is operating, this transistor is switched off. The side of the resistor R45 that is coupled to the transistor is also coupled to a resistor R46 which is coupled with its other side to the (not shown) other tuned circuits of the VHF section VS3 (see FIG. 3) for supplying a switching signal S4.

The other tuned circuit VTCH4 of the mixer oscillator stage comprises an inductance L42 and a series arrangement of a varicap diode D42 and a capacitance C46, whereby a tuning voltage VT is supplied at the connection point of the varicap diode D42 and the capacitance C46. The connection point of the varicap diode D42 and the inductance L42 is coupled via a resistance R42 to ground. The tuned circuit VTCH4 is coupled via capacitances C43 and C44 to a second VHF oscillator OSVH4 of the mixer oscillator integrated circuit MOIC4.

In the above description, the idea of the invention has been described on the basis of some schematic diagrams. The man skilled in the art will be well aware of a lot of different solutions that fall within the scope of the invention concerned.

A tuner according to the invention can be used in a television receiver, a multi-media receiver, etc.

The detecting means can be incorporated in the mixer oscillator stage as is indicated in the schematic diagram of figure.

Further it is, for example, possible to integrate the detector means in the mixer oscillator integrated circuit MOIC.

The invention provides a tuner, a mixer oscillator stage and a receiver having such a tuner whereby by splitting the VHF oscillator in two separate VHF oscillators (so no switching diodes in the VHF tuned circuits of the oscillator). Further, detecting means are used to switch the tuned circuits of the VHF section. This results in an improved performance and lowered costs of the tuner.

What is claimed is:

1. A tuner for tuning an input signal, said tuner comprising;

an input for receiving the input signal:

a UHF section coupled to the input for handling UHF signals, and a VHF section coupled to the input for handling VHF signals; and a mixer oscillator stage coupled to outputs of the UHF section and the VHF section, said mixer oscillator stage comprising UHF oscillation means with a UHF tuning circuit and VHF oscillation means with VHF tuning means, an output of said mixer oscillator stage being coupled to an output of the tuner, characterized in that the VHF oscillation means comprises a first and a second VHF oscillator, said VHF tuning means comprises a first and a second VHF tuning circuit coupled, respectively, to said first and second VHF oscillators, for providing a first and a second VHF frequency range, respectively, and the tuner further comprises detecting means for detecting which of said first and second VHF oscillators is operating, the detecting means supplying a switching signal to switchable elements in the VHF section.

2. A tuner as claimed in claim 1, characterized in that the VHF section comprises a series arrangement of a switchable tuned input circuit, an amplifier stage, a switchable primary high frequency band filter and a switchable secondary high frequency band filter, said switchable elements being under switching control of the detecting means.

3. A tuner as claimed in claim 2, characterized in that the detecting means comprises a diode detector coupled to the first VHF tuning circuit, the detecting means being part of the mixer oscillator stage.

4. Mixer oscillator stage for use in a tuner for tuning an input signal, said tuner comprising:

an input for receiving the input signal;

a UHF section coupled to the input for handling UHF signals, and a VHF section coupled to the input for handling VHF signals; and said mixer oscillator stage coupled to outputs of the UHF section and the VHF section, said mixer oscillator stage comprising UHF oscillation means with a UHF tuning circuit and VHF oscillation means with VHF tuning means, an output of said mixer oscillator stage being coupled to an output of the tuner. characterized in that the VHF oscillation means comprises a first and a second VHF oscillator, said VHF tuning means comprises a first and a second VHF tuning circuit coupled, respectively, to said first and second VHF oscillators, for providing a first and a second VHF frequency range, respectively, and the tuner further comprises detecting means for detecting which of said first and second VHF oscillators is operating, the detecting means supplying a switching signal to switchable elements in the VHF section.

5. A receiver comprising a tuner as claimed in claim 1.

* * * * *